United States Patent
Aldefeld et al.

(10) Patent No.: US 6,714,011 B1
(45) Date of Patent: Mar. 30, 2004

(54) MR APPARATUS AND GRADIENT SATURATION METHOD FOR SUPPRESSING MR SIGNALS FROM PERIPHERAL REGIONS SITUATED OUTSIDE AN ISOCENTER

(75) Inventors: Bernd Aldefeld, Hamburg (DE); Johannes Adrianus Overweg, Germany (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 55 days.

(21) Appl. No.: 09/596,215

(22) Filed: Jun. 19, 2000

(30) Foreign Application Priority Data

Jun. 19, 1999 (DE) .......................... 199 28 110

(51) Int. Cl.[7] .............................................. G01V 3/00
(52) U.S. Cl. ...................................................... 324/318
(58) Field of Search ................... 324/309, 307, 324/300, 314; 600/420

(56) References Cited

U.S. PATENT DOCUMENTS

| | | | | |
|---|---|---|---|---|
| 4,799,012 A | * | 1/1989 | Hanawa ........................ | 324/309 |
| 4,939,461 A | * | 7/1990 | Kunz ............................ | 324/309 |
| 5,451,875 A | * | 9/1995 | Patrick et al. ................. | 324/318 |
| 5,467,016 A | | 11/1995 | Thomasson ................... | 324/309 |
| 5,471,141 A | * | 11/1995 | Yoshida et al. ............... | 324/314 |
| 5,500,593 A | * | 3/1996 | Loncar et al. ................. | 324/307 |
| 6,320,377 B1 | * | 11/2001 | Miyazaki et al. ............. | 324/306 |
| 6,335,620 B1 | * | 1/2002 | Weissenberger .............. | 324/307 |

FOREIGN PATENT DOCUMENTS

| | | | | |
|---|---|---|---|---|
| DE | 3803052 A1 | 11/1988 | .......... | G01N/24/08 |
| EP | 0332250 A2 | 9/1989 | .......... | G01R/33/20 |

OTHER PUBLICATIONS

"Echo–Planar Imaging Theory, Technique and Application Magnetic Resonance Imaging in a Fraction of a Second" textbook 1998 by F. Schmitt, M.K. Stehling and R. Turner chapter 4 p. 77 Figure 4c.*

* cited by examiner

Primary Examiner—Diego Gutierrez
Assistant Examiner—Tiffany A. Fetzner
(74) Attorney, Agent, or Firm—John Vodopia

(57) ABSTRACT

The invention relates to an MR method wherein disturbing MR signals from peripheral regions outside the isocenter are suppressed in that a location-dependent, brief, steady magnetic field is produced simultaneously with an RF pulse. When the field strength of the magnetic field in the peripheral regions is either larger or smaller than that at the isocenter, it can be achieved that exclusively the nuclear magnetization in the peripheral regions is excited, which magnetization can subsequently be dephased. The subsequent MR sequence then influences only the region around the isocenter.

6 Claims, 3 Drawing Sheets

MR APPARATUS AND GRADIENT SATURATION METHOD FOR SUPPRESSING MR SIGNALS FROM PERIPHERAL REGIONS SITUATED OUTSIDE AN ISOCENTER

The invention relates to an MR method for suppressing MR signals from peripheral regions situated outside an isocenter.

The invention also relates to an MR apparatus for carrying out such a method and to a coil system which is suitable for that purpose.

MR images which are to reproduce a given field of view (FOV) are liable to contain artefacts which originate from undesirable MR signals which occur in peripheral regions in which the conditions for magnetic resonance are satisfied as well as in the FOV. Particularly in MR apparatus comprising comparatively short gradient coils it may occur that the gradient of the magnetic field generated by these coils decreases and reverses its sign already at a small distance from the isocenter. In the peripheral regions in which such reversal occurs the so-called $B_0$ field may still be so strong that the magnetic resonance conditions are also satisfied therein, giving rise to undesirable MR signals when these peripheral regions are covered by the RF magnetic field. It is not possible to saturate the nuclear magnetization in the peripheral regions in conformity with DE-A 36 04 281 (PHD 86-018), because for the stated variation in space of the gradient the magnetic field in the peripheral regions may be of the same magnitude as in the region around the isocenter.

Therefore, it is an object of the present invention to provide a method in which the MR signals from these peripheral regions can be effectively suppressed. This object is achieved according to the invention by taking the following steps:
 a) generating a location-dependent, brief steady magnetic field whose field strength in the peripheral regions is either larger or smaller than its field strength at the isocenter,
 b) generating at least one RF pulse during the application of the magnetic field, which RF pulse excites the nuclear magnetization in the peripheral regions but not in the isocenter,
 c) dephasing the excited nuclear magnetization.

The invention is based on the consideration that when a location-dependent, brief steady magnetic field can be generated whose field strength in the peripheral regions is either larger or smaller than that at the isocenter, it will always be possible to generate an RF pulse which excites the nuclear magnetization only in the peripheral regions but not at the isocenter. Subsequently, the excited nuclear spins in the peripheral regions can be dephased so that (for the time being) MR signals can no longer occur therein due to this saturation.

The term "brief steady magnetic field" is to be understood to mean hereinafter a magnetic field which does not change its polarity during a period of time amounting to at least a few periods of the RF oscillation contained in the RF pulse. The term "brief" will also be omitted hereinafter when no mix-ups with the steady ($B_0$) main magnetic field are to be expected. Typically, the brief steady magnetic field is constant during a period of time of the order of magnitude of 1 ms.

The embodiment disclosed in claim 2 ensures that the MR examination subsequent to the saturation is not influenced by the location-dependent brief steady magnetic field.

Claim 3 discloses an MR apparatus for carrying out the method disclosed in claim 1, including a main field magnet for generating a uniform, steady magnetic field. The location-dependent, steady magnetic field is then generated by means of an (additional) saturation coil system which is constructed in such a manner that the magnetic field in the peripheral regions to both sides of the center of this coil is either stronger or weaker than that at its isocenter. Such a saturation coil system may have the same length as, or may even be shorter than, the gradient coil whose field variation is liable to give rise to the undesirable MR signals claim 4 describes a preferred embodiment of such an MR apparatus. When the two lateral coil sections have the same number of turns and are situated at the same distance from the central coil section, a symmetrical field variation will be obtained. However, it is alternatively possible to realize a non-symmetrical variation by changing of the distance or the number of turns.

The gradient coil system in the embodiment described in claim 5 is interleaved in space with the saturation coil system so that no additional volume is required for the saturation coil.

Claim 6 describes a coil system which is suitable for use in an MR apparatus for carrying out the method according to the invention.

The invention will be described in detail hereinafter with reference to the drawings. Therein:

Figure 1:
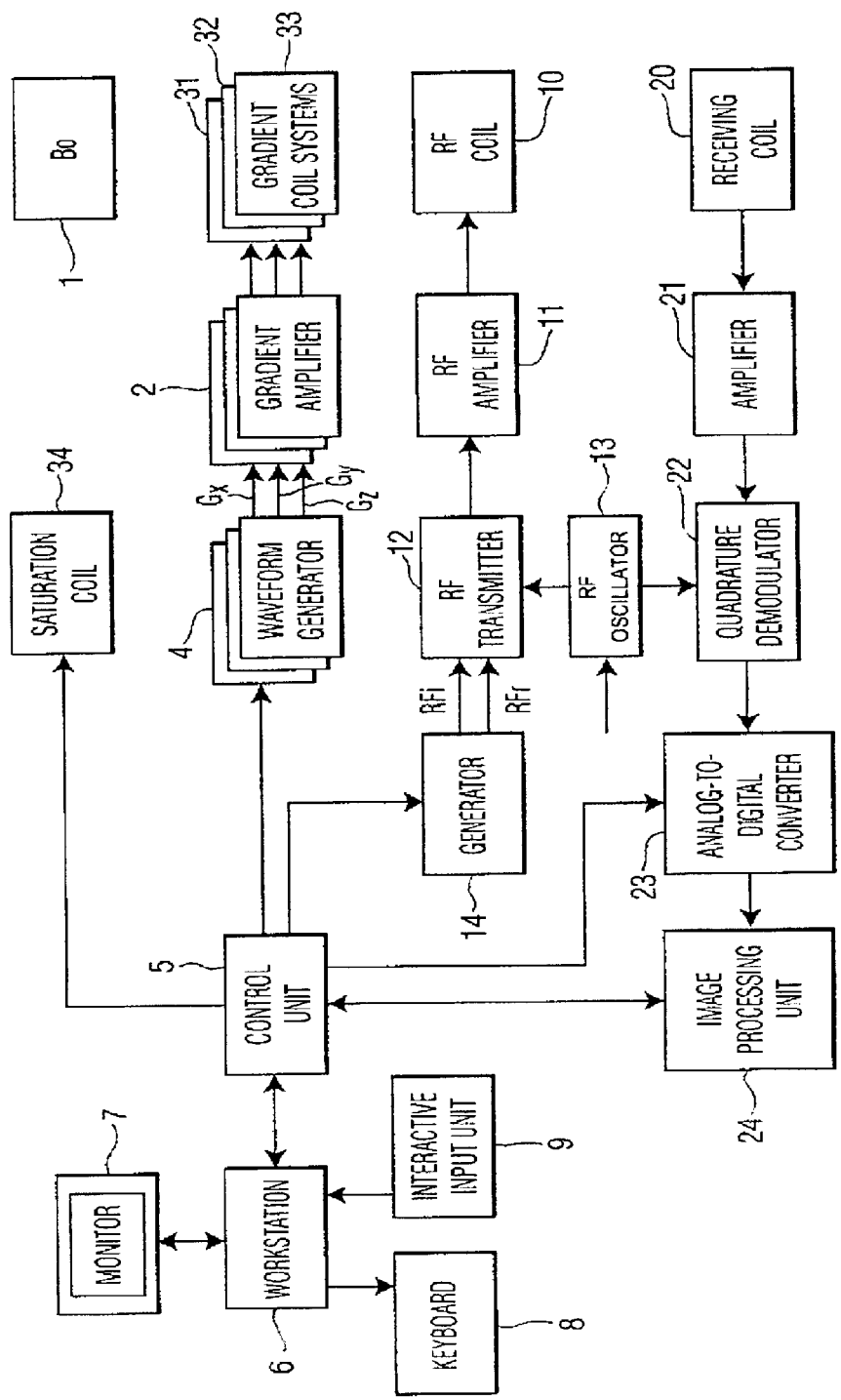
FIG. 1 shows a block diagram of an MR apparatus according to the invention.

The reference numeral 1 in FIG. 1 denotes a diagrammatically shown main field magnet which generates a steady, essentially uniform magnetic field $B_0$ which extends, for example in the z direction and has a strength of, for example 1.5 Tesla in an examination zone (not shown). The z direction is oriented in the longitudinal direction of a patient table which is not shown and on which a patient is arranged during an examination.

There are also provided gradient coil systems 31, 32 and 33 for generating magnetic gradient fields $G_x$, $G_y$ and $G_z$ which extend in the z direction and have gradients in the x, the y and the z direction, respectively. The currents for the coil systems 31, 32 and 33 are delivered by a respective gradient amplifier 2. Their variation in time is imposed by a waveform generator 4, i.e. separately for each direction. The waveform generator 4 is controlled by an arithmetic and control unit 5 which calculates the variation in time of the magnetic gradient fields $G_x$, $G_y$, $G_z$ that is required for a given examination method, said variation being loaded into the waveform generator 4. During the examination the signals are read out from the waveform generator and applied to the gradient amplifier device 2 which derives the currents required for the coil systems 31, ,32 and 33 therefrom.

The control unit 5 also co-operates with a workstation 6 which is provided with a monitor 7 for the display of MR images. Entries can be made via a keyboard 8 or an interactive input unit 9.

The nuclear magnetization in the examination zone can be excited by RF. pulses from an RF coil 10 which is connected to an RF amplifier 11 which amplifies the output signals of an RF transmitter 12. The RF transmitter 12 modulates the (complex) envelopes of the RF pulses with the carrier oscillations supplied by an oscillator 13, the frequency of said oscillations corresponding to the Larmor frequency (approximately 63MHz in the case of a main magnetic field of 1.5 Tesla). The arithmetic and control unit loads the complex envelope into a generator 14 coupled to the transmitter 12.

The MR signals generated in the examination zone are picked up by a receiving coil 20 and amplified by an amplifier 21. Instead of an RF coil 10 for generating RF pulses and a receiving coil 20 for receiving MR signals, there may also be provided a single coil which generates the RF pulses and subsequently receives the MR signals.

In a quadrature demodulator 22 the MR signal amplified in the amplifier 21 is demodulated by two 90° offset carrier oscillations of the oscillator 13, thus yielding two signals which may be considered as the real part and the imaginary part of a complex MR signal. These signals are applied to an analog-to-digital converter 23 which derives MR data therefrom. An image processing unit 24 generates an MR image from MR data derived from an MR signal. This MR image can be displayed on the monitor 7.

Additionally there is provided a coil system 34 for saturating the nuclear magnetization in the peripheral regions. This coil will be referred to as the saturation coil hereinafter. The strength and the switching on and off of the brief steady direct current through the saturation coil 34 is also controlled by the arithmetic and control unit 5. The current variation in time in the saturation coil typically is trapezoidal with a duration of some ms.

Figure 2:
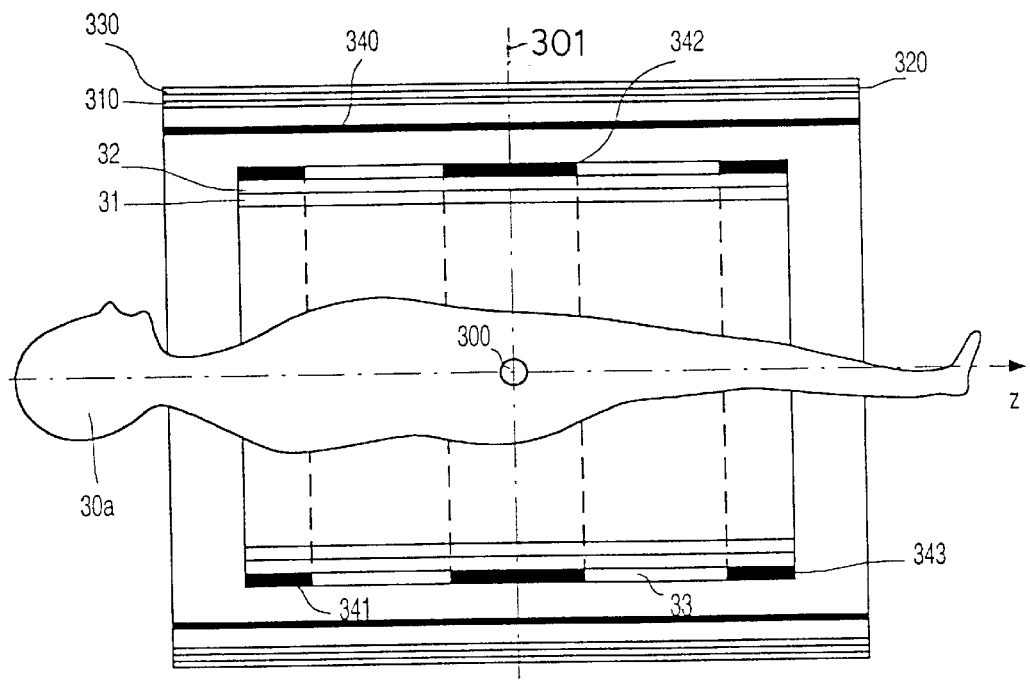
FIG. 2 shows the arrangement in space of a part of such an apparatus.

FIG. 2 shows diagrammatically inter alia the gradient coils 31, 32 and 33 as well as the saturation coil. The coils are arranged so as to be coaxial with one another, the coil axis being coincident with the z direction, i.e. with the longitudinal direction of the patient or with the longitudinal direction of the patient table (not shown), so that the patient is enclosed by said coils. All coils generate magnetic fields which extend in the z direction, the magnetic field of the inner gradient coil 31 having a gradient which extends (vertically) in the x direction, whereas the enclosing gradient coil 32 has a gradient extending in the y direction (perpendicular to the plane of drawing) and the outer gradient coil 33 has a gradient extending (horizontally) in the z direction. At the isocenter 300 the magnetic fields generated by the three coils are zero whereas they vary in the opposite sense outside the isocenter, for example, at a head 30a of a patient under examination.

The isocenter 300 coincides with the coil axis or with the center of the coils 31, 32 and 33. The isocenter is customarily also situated at the center of the main field magnet and at the center of the RF coil which is not shown in FIG. 2. The gradient coil 33 may be a coil system of the Helmholtz type which consists of two identical coil sections which are symmetrically arranged relative to a central plane 301 extending perpendicularly to the z axis and through the isocenter, a common current flowing in opposite directions through said coil sections.

The saturation coil 34 consists of three electrically series-connected coil sections 341, 342 and 343 which are mutually offset in the z direction and are arranged symmetrically relative to the plane 301. The two outer coil sections 341 and 343 comprise the same number of turns whereas the coil section 342 at the center has approximately twice the number of turns and its winding sense opposes that of the two outer sections 341 and 343. When a common current flows through these three coil sections, therefore, its direction in the central coil section opposes that in the two outer coil sections.

The central coil section 342 is enclosed by the two sections of the gradient coil 33, whereas the two outer coil sections 341 and 342 enclose these two sections of the coil 33. The length of the coil assembly formed by the interleaved coils 33 and 34 does not exceed that of the two other gradient coils 31 and 32, so that the additional saturation coil 34 does not require an additional volume for building in.

The coils 31 to 34 are enclosed by four concentrically arranged coils 310, 320, 330 and 340 whose characteristic is similar to that of the coils 31 to 34 and which are traversed by a current simultaneously with the coils 31 to 34, be it in respective opposite directions. As a result, for example, the magnetic field of the coil 310 in the outer space, that is to say beyond the coils 310–340, compensates the magnetic field of the coil 31. This compensation is known per se as "active shielding".

Figure 3:
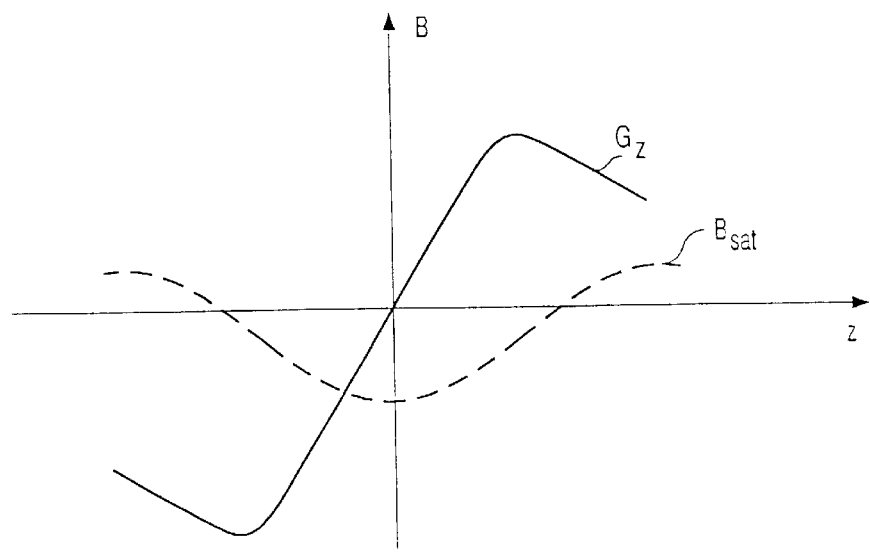
FIG. 3 shows the resultant variation of the magnetic fields.

FIG. 3 shows the variation in space in the z direction of the magnetic field $G_z$ produced by the coil 33. The magnetic field strength varies anti-symmetrically with respect to the central plane 301, i.e. on the one side it increases linearly and on the other side it decreases linearly. The field strength reaches it maximum approximately at the center of the coil section 33, after which it decreases again for larger positive or negative values of z. The gradient of this magnetic field in the z direction, therefore, is constant in the region around the isocenter and decreases towards the periphery, its sign then being reversed. In the peripheral regions to both sides of this inversion point the gradient field (and the field $B_0$ of the main field magnets) may assume equally high values, with the result that the resonance criterion is satisfied in the peripheral region as well as in a region around the isocenter, so that the MR signals arising can no longer be unambiguously assigned to one of these regions.

FIG. 3 additionally shows the variation in space of the magnetic field $B_{sat}$ generated by the saturation coil 34. Starting from a negative value in the central plane, this field increases towards both sides, the sign of the field strength being reversed in said peripheral regions. In the case of a symmetrical construction of the saturation coil 34, the variation of $B_{sat}$ will be symmetrical; otherwise an asymmetrical variation will occur, be it so that, starting from the central plane (z=0), the magnetic field still changes in the same sense in the direction of positive and negative z values.

When the direction of the current through the saturation coil 34 is reversed, the field strength in the central plane 301 will be positive and that in the peripheral regions negative. The field strength in the central plane and/or in the peripheral regions can be changed by modifying the construction of the coil. It is merely important that, starting from the central plane 301, the field strength of the magnetic field produced by the coil 34 changes in the same sense to both sides and that the difference in field strength between the peripheral regions on the one side and the isocenter on the other side is sufficiently large.

Figure 4:
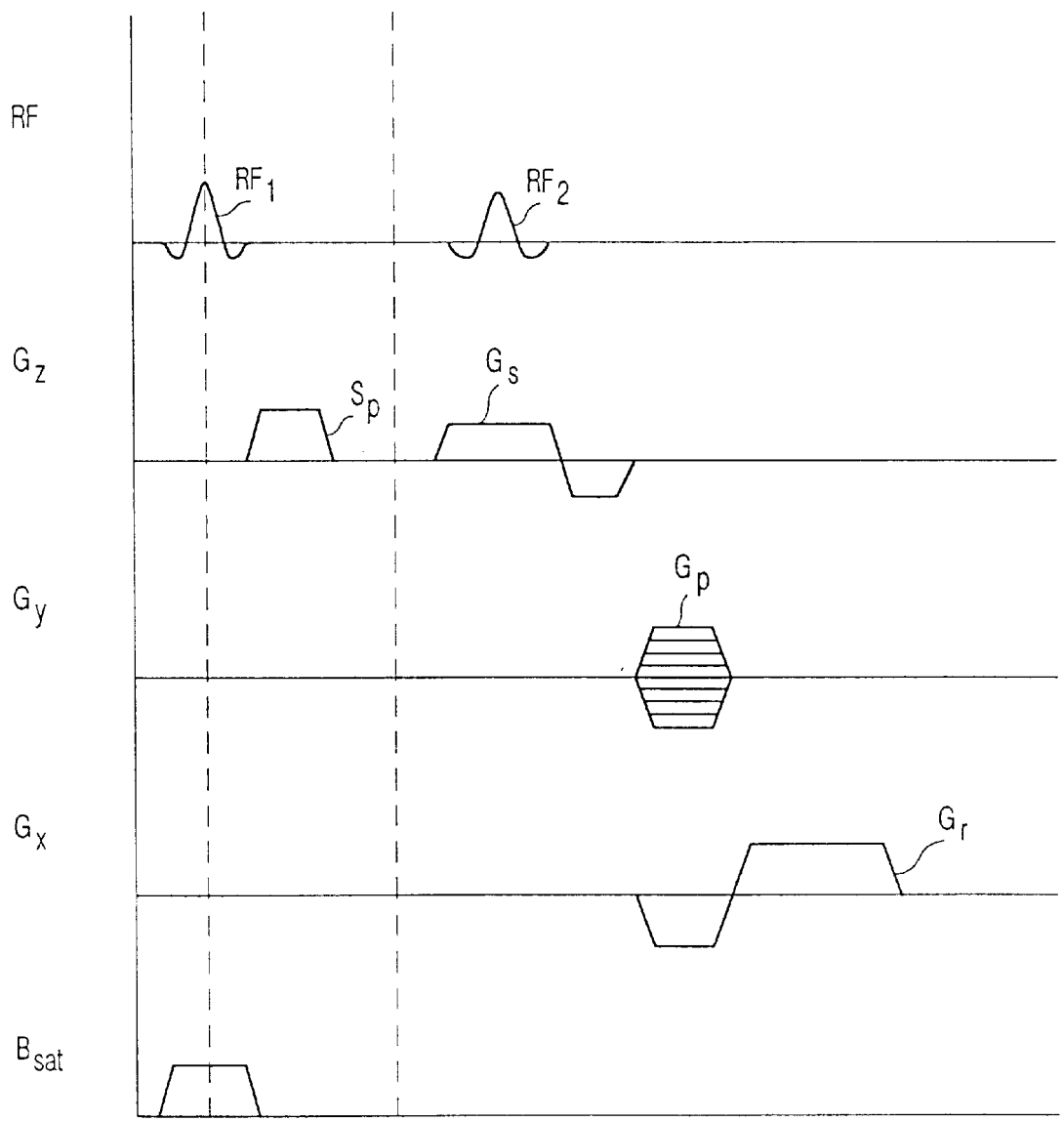
FIG. 4 shows an example of a sequence that can be executed thereby.

FIG. 4 shows the variation in time of various signals in an MR sequence in conformity with the 2DFT method where the undesirable signals from the peripheral regions are suppressed by means of the field $B_{sat}$. The method involves two temporally successive segments. In the first segment the nuclear magnetization in the peripheral regions is saturated and in the second segment a conventional sequence is applied, i.e. according to the 2DFT method in the present example.

In a first segment an RF pulse $RF^1$ (first line) is generated and at the same time the magnetic field $B_{sat}$ ($5^{th}$ line) of the saturation coil 34 is switched on. When the central frequency of this high-frequenncy pulse and its bandwidth and possibly the strength of the current through the saturation coil are suitably chosen, it is achieved that this pulse excites exclusively the nuclear magnetization in two regions outside the isocenter, but not in the region around the isocenter. The excited nuclear magnetization is subsequently dephased by a so-called "spoiler" Sp. A spoiler is to be understood to mean the switching on and off of a gradient field (for example, having a gradient extending in the z direction, second line). However, the same effect can also be achieved by selecting a sufficiently long switch-on time for the magnetic field $B_{sat}$ generated by the coil 34.

Thus, the nuclear magnetization in the edge regions has been dephased whereas it is still the same in the region around the isocenter. The subsequent imaging sequence can then act only on the region around the isocenter. First an RF pulse $RF_2$ is then switched on in conjunction with a slice selection gradient $G_s$, for example in the z direction (second line).

After this slice-selective RF pulse, a phase encoding gradient $G_p$ is switched on, for example in the y direction (third line), and the MR signal thus produced is read out under the influence of a read-out gradient $G_r$. For as long as the nuclear magnetization in the peripheral regions remains dephased, further excitations of the slice may take place with a modified phase encoding gradient $G_p$, without it being possible for undesirable MR signals to arise in the peripheral regions.

What is claimed is:

1. An MR method for suppressing MR signals from peripheral regions situated outside a specified FOV region proximate an isocenter of a main field magnet, said method comprising:

a) generating a location-dependent magnetic field ($B_{sat}$) pulse with use of a saturation coil system, the saturation coil system being separate and distinct from the main field magnet, the location-dependent magnetic field ($B_{sat}$) pulse having a field strength in the peripheral regions situated outside the FOV region proximate the isocenter of the main field magnet either larger or smaller than the location-dependent magnet field pulse's field strength at the isocenter of the main field magnet, wherein the saturation coil system includes three coaxial coil sections which are offset in space and that, in an operating condition, the direction of the current in a central coil section of the saturation coil system opposes that of the currents in two outer coil sections of the saturation coil system;

b) generating at least one RF pulse ($RF_1$) with the use of an RF coil during an application of the magnetic field pulse generated by the saturation coil system, wherein the RF pulse excites a nuclear magnetization in the peripheral regions situated outside the FOV region proximate the isocenter of the main field magnet but not in the FOV region around the isocenter; and c) dephasing the excited nuclear magnetization utilizing one of magnetic field gradients $G_x$, $G_y$, and $G_z$ of a gradient coil system, wherein the gradient coil system is separate and distinct from the main field magnet and the saturation coil system.

2. The MR method as claimed in claim 1, wherein the location-dependent magnetic field ($B_{sat}$) pulse is switched off after the dephasing of the nuclear magnetization in the peripheral regions situated outside the FOV region proximate the isocenter of the main field magnet and prior to generation of a second RF pulse and an excitation of the nuclear magnetization in the FOV region around the isocenter of the main field magnet not affected by the dephasing.

3. The MR method as claimed in claim 1, wherein the location-dependent magnetic field ($B_{sat}$) pulse comprises a magnetic field which does not change its polarity during a period of time on the order of at least a few periods of an RF oscillation contained in the RF pulse.

4. The MR method as claimed in claim 3, further wherein the magnetic field of the location-dependent magnetic field ($B_{sat}$) pulse is constant during a period of time on the order of 1 ms.

5. An MR apparatus including a main field magnet for generating a uniform, steady magnetic field, said apparatus further comprising:

a saturation coil system in addition to said main field magnet, said saturation coil system for generating a location-dependent magnetic field of a limited duration which can be superimposed on the uniform magnetic field of the main field magnet, and whose field strength in the peripheral regions situated outside a FOV region proximate an isocenter of the main field magnet is either larger or smaller than its field strength at the isocenter of the main field magnet, wherein said saturation coil system includes three coaxial coil sections which are offset in space and that, in an operating condition, the direction of the current in a central coil section of said saturation coil system opposes that of the currents in two outer coil sections of said saturation coil system;

means for generating at least one RF pulse ($RF_1$) during the application of the location-dependent magnetic field generated by said saturation coil system, wherein the RF pulse excites the nuclear magnetization in the peripheral regions situated outside the FOV region proximate the isocenter of the main field magnet but not at the FOV region; and means for dephasing the excited nuclear spins utilizing one of magnetic field gradients $G_x$, $G_y$, and $G_z$ of a gradient coil system, wherein the gradient coil system is separate and distinct from the saturation coil system and the main field magnet.

6. The MR apparatus as claimed in claim 5, including at least one gradient coil system for generating magnetic gradient fields, wherein the gradient coil system includes two coil sections, each of which are arranged between the central coil section of said saturation coil system and one of the two outer coil sections of said saturation coil system.

* * * * *